United States Patent
Yu et al.

(10) Patent No.: US 9,153,733 B2
(45) Date of Patent: Oct. 6, 2015

(54) LIGHT EMITTING DIODE SUBSTRATE

(71) Applicant: Lextar Electronics Corporation, Hsinchu (TW)

(72) Inventors: Wei-Chang Yu, Kaohsiung (TW); Chien-Cheng Chang, Zhudong Township (TW); Chih-Sheng Hsu, Sanwan Township (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/094,971

(22) Filed: Dec. 3, 2013

(65) Prior Publication Data

US 2015/0048385 A1    Feb. 19, 2015

(30) Foreign Application Priority Data

Aug. 13, 2013    (TW) .............. 102129013 A

(51) Int. Cl.
    H01L 21/20    (2006.01)
    H01L 33/02    (2010.01)
    H01L 33/10    (2010.01)
    H01L 33/22    (2010.01)

(52) U.S. Cl.
    CPC ............. *H01L 33/02* (2013.01); *H01L 33/10* (2013.01); *H01L 33/22* (2013.01); *H01L 2933/0083* (2013.01)

(58) Field of Classification Search
    CPC ..... H01L 33/02; H01L 21/3065; H01L 33/22; H01L 21/02367; H01L 21/023065; H01L 21/20; H01L 21/36; H01L 21/67323; H01L 21/02647; H01L 21/0265
    USPC ..................... 438/681, 90, 481, 483
    See application file for complete search history.

(56) References Cited

U.S. PATENT DOCUMENTS

| | | | | |
|---|---|---|---|---|
| 2001/0029086 | A1* | 10/2001 | Ogawa et al. | 438/448 |
| 2007/0166984 | A1* | 7/2007 | Kim | 438/597 |
| 2008/0233730 | A1* | 9/2008 | Yu et al. | 438/596 |
| 2009/0137094 | A1* | 5/2009 | Lee | 438/424 |
| 2012/0012874 | A1* | 1/2012 | Morioka et al. | 257/98 |
| 2013/0298980 | A1* | 11/2013 | Fogel et al. | 136/256 |

FOREIGN PATENT DOCUMENTS

| | | |
|---|---|---|
| TW | 200921936 A | 5/2009 |
| TW | 201117283 A | 5/2011 |

OTHER PUBLICATIONS

Roskowskiet al. Maskless Pendeo-Epitaxial Growth of GaN Films, Journal of Electronic Materials, vol. 31, No. 5, 2002, pp. 421-428.*
Kuryatkov et al. Analysis of nonselective plasma etching of AlGaN by CF4/Ar/Cl2, Journal of Applied Physics 97, 073302 (2005), pp. 073302-1-073302-5.*
Lai et al. Enhancement of light output power of GaN-based light-emitting diodes with photonic quasi-crystal patterned on p-GaN surface and n-sde sidewall roughing, Nanoscale Research Letters 2013, pp. 1-6.*
Derenge et al. Pendeo-Epitaxy Process Optimization for GaN for Novel Devices Applications, Army Research Laboratoy, 2008, pp. 1-22.*

* cited by examiner

*Primary Examiner* — Galina Yushina
(74) *Attorney, Agent, or Firm* — Moser Taboada

(57) ABSTRACT

A method of manufacturing a light emitting diode (LED) substrate includes following steps: providing a nano-patterned substrate, which has a plurality of convex portions and a plurality of first concave portions that are spaced apart from each other, wherein each first concave portion has a depth (d1); forming a plurality of protection structures to cover each convex portion, and exposing a bottom surface of each first concave portion; performing an anisotropic etching processing to etch the bottom surface of each first concave portion which is not covered by the protection structure so as to form a plurality of second concave portions having a depth (d2), and d2 is greater than d1.

8 Claims, 6 Drawing Sheets

LIGHT EMITTING DIODE SUBSTRATE

RELATED APPLICATIONS

This application claims priority to Taiwan Application Serial Number 102129013, filed Aug. 13, 2013, which is herein incorporated by reference.

BACKGROUND

1. Field of Invention

The present invention relates to light emitting diode (LED) substrate.

2. Description of Related Art

A conventional LED substrate is generally imprinted with a nano-patterned sapphire substrate technology to form a nano-pattern thereon, so as to increase light extraction efficiency. The nano-patterned sapphire substrate technology often uses a nanoimprint lithography process because such process is simple and quick and suitable for use in industrial production.

A concave portion of the nano-pattern formed by a conventional method for manufacturing a LED substrate does not have a sufficient depth, thus leading to unsatisfactory light extraction efficiency. FIG. 1 is a schematic diagram showing a light extraction effect within a conventional light emitting diode structure. A conventional light emitting diode structure has a conventional substrate 600 and a light emitting multilayer structure 500. Depths of concave portions formed on the conventional substrate 600 may only reach to 300 nm, thus limiting the improvement of brightness. Because the depths of the concave portions formed on the conventional substrate 600 are not deep enough, after being generated by the multiple-layer-emitting structure 500, the light passes through the conventional substrate 600 along a direction 700 and resulting brightness reduction.

SUMMARY

An aspect of the present invention is to provide a method of manufacturing a light emitting diode substrate.

According to an embodiment of the present invention, a method of manufacturing a light emitting diode substrate (LED) includes the following steps: providing a nano-patterned substrate, having a plurality of convex portions and a plurality of first concave portions that are spaced apart from each other, wherein each first concave portion has a first depth (d1); forming a plurality of protection structures to cover each of the convex portions, and exposing a bottom surface of each of first concave portions; performing an anisotropic etching process to etch the bottom surface of each of the first concave portions which is not covered by the protection structure so as to form a plurality of second concave portions having a second depth (d2), wherein d2 is greater than d1.

In an embodiment of the present invention, the nano-patterned substrate is formed by a nanoimprint lithography.

In an embodiment of the present invention, the protection structures are formed using a maskless pendeo-epitaxy process.

In an embodiment of the present invention, a top portion of each of the convex portions has a first width (w1), each of the protection structures has a width (w2), and 0<w1<w2.

In an embodiment of the present invention, the protection structures are formed using a metal-organic chemical vapor deposition process.

In an embodiment of the present invention, the protection structures comprise GaN, InGaN or AlGaN.

In an embodiment of the present invention, the anisotropic etching process is performed using an inductively coupled plasma etching process.

In an embodiment of the present invention, process gas used in the inductively coupled plasma etching process is a mixture of $CF_4$, $Cl_2$, and $BCl_3$.

In an embodiment of the present invention, a ratio of components of the process gas is $CF_4:Cl_2:BCl_3=6:2:1$.

According to an embodiment of the present invention, a light emitting diode substrate is a nano-patterned substrate. A pattern of the light emitting diode substrate includes a plurality of convex portions and a plurality of concave portions that are spaced apart from each other. Each of the concave portions having a depth greater than a distance between two adjacent tops of the convex portions, and a depth of each of the concave portions is deeper than 1 μm.

In an embodiment of the present invention, two adjacent concave portions are spaced at a distance ranging from 400 nm to 800 nm.

According to an embodiment of the present invention, a light emitting diode structure includes a light emitting multiple-layer structure stacked on the light emitting diode substrate.

In an embodiment of the present invention, the light emitting multiple-layer structure includes a P type semiconductor layer, an active layer, and a N type semiconductor layer.

The invention provides a manufacture process of a LED substrate, which is convenient and fast with high yield, and is effectively applicable to the LED production. The concave portions of the LED substrate of this invention is deepened, thus improving the problems that the concave portions of the conventional light emitting diode substrate cannot be too deep to cause a poor light extraction effect. After the LED structure of this invention is collocated with the LED substrate of this invention, the ratio of the light passing through and absorbed by the substrate is apparently decreased, in comparison with the conventional method. On the other hand, in comparison with the conventional method, more light of this invention can be reflected as front light, which can be effectively utilized. Overall speaking, the light extraction efficiency of this invention is greater than that of the conventional method.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 2:
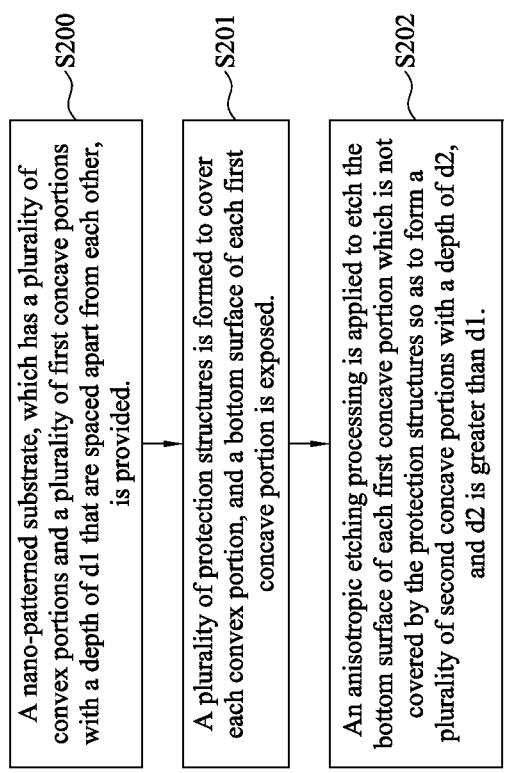
FIG. 2 is a flow chart of a manufacturing method of a LED substrate according to an embodiment of the present invention.

FIG. 2 is a flow chart of a manufacturing method of a LED substrate according to an embodiment of the present invention. A method of manufacturing a light emitting diode substrate 100 (see FIG. 5) includes the following steps. In step S200, a nano-patterned substrate is provided, which has a plurality of convex portions and a plurality of first concave portions with a depth d1 that are spaced apart from each other. In step S201, a plurality of protection structures is formed to cover each convex portion, and a bottom surface of each first concave portion is exposed. In step S202, an anisotropic etching process is performed to etch the bottom surface of each first concave portion, which is not covered by the protection structures so as to form a plurality of second concave portions with a depth d2, and d2 is greater than d1.

Figure 3:
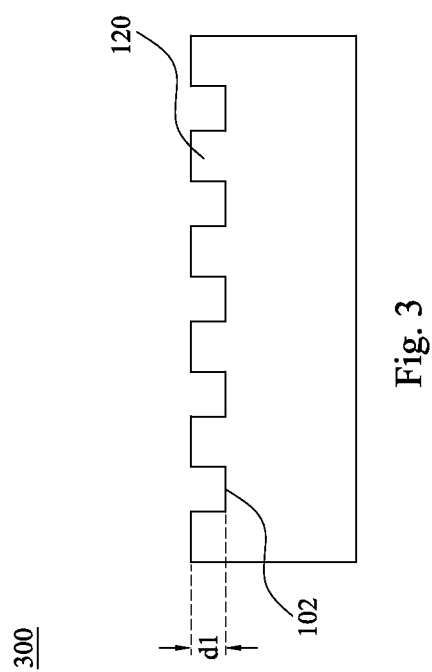
FIG. 3 is a schematic diagram of a nano-patterned substrate according to an embodiment of the present invention.

Please refer to FIG. 2 and FIG. 3. FIG. 2 is a flow chart of a manufacturing method of a LED substrate according to an embodiment of the present invention. FIG. 3 is a schematic diagram of a nano-patterned substrate according to an embodiment of the present invention. In step S200, a nano-patterned substrate 300 is provided, which has a plurality of convex portions 120 and a plurality of concave portions 102 (the same as "the first concave portions" introduced above) that are spaced apart from each other. Each concave portion 102 has a depth d1. The nano-patterned substrate 300 is formed by nanoimprint lithography.

The person having ordinary skill in the art can make proper modifications to the materials of the nano-patterned substrate 300 according to actual needs.

Figure 4:
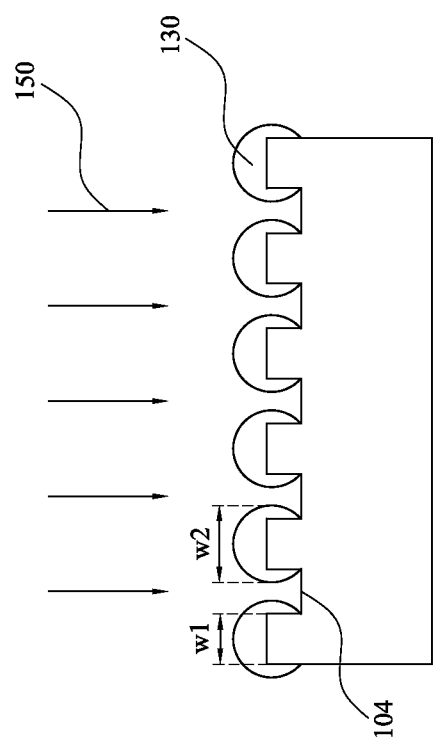
FIG. 4 is schematic diagram showing a protection structure formed on a according to an embodiment of the present invention.

Please refer to FIG. 3 and FIG. 4. FIG. 4 is schematic diagram showing a protection structure formed on a according to an embodiment of the present invention. After a nano-patterned substrate 300 is provided, a plurality of protection structures 130 is formed to cover each convex portion 120, but to expose a bottom surface of each first concave portion 104. In the nano-patterned substrate 300, a top portion of each convex portion 120 has a width w1, and each protection structure 130 has a width w2, and 0<w1<w2. In an embodiment of the present invention, the protection structure 130 is formed by a maskless pendeo-epitaxy process. In another embodiment of the present invention, the protection structure 130 is formed by a metal-organic chemical vapor deposition process.

A person having ordinary skill in the art can make proper modifications to the materials of the protection structure 130 according to actual needs.

Figure 5:
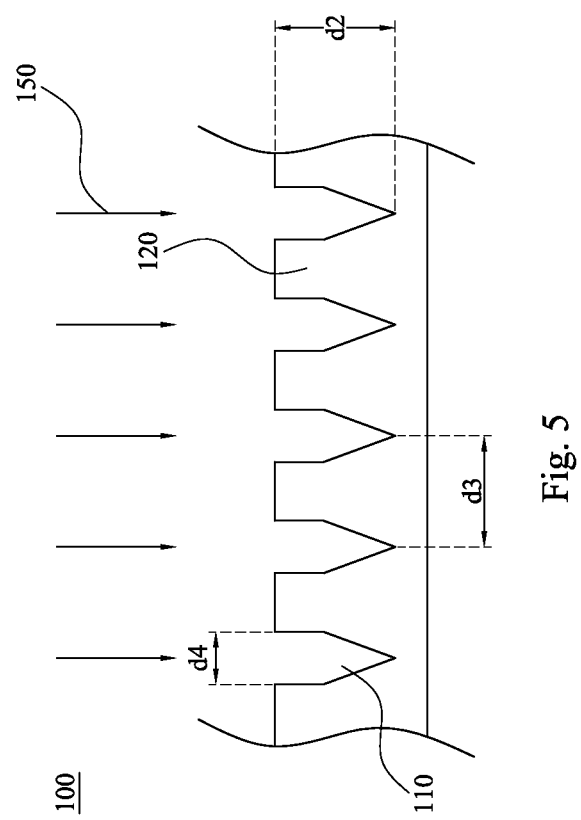
FIG. 5 is schematic diagram showing that an anisotropic etching process is performed to form a LED substrate according to an embodiment of the present invention.

Please refer to FIG. 4 and FIG. 5. FIG. 5 is schematic diagram showing that an anisotropic etching process is performed to form a LED substrate according to an embodiment of the present invention. After a protection structure 130 is formed on the nano-patterned substrate 300 (referring to FIG. 3), an anisotropic etching process is applied to the nano-patterned substrate 300 (referring to FIG. 3) in order to etch the bottom surface 104 of each concave portion (the same as "second concave portion" introduced above) which is not covered by the protection structure 130, so as to form a plurality of concave portions 110 with a depth d2, and d2 is greater than d1 (referring to FIG. 3). The anisotropic etching processing is performed by an inductively coupled plasma etching process. The inductively coupled plasma etches the concave portions 110 in a direction 150 to deepen the depth of the concave portions 110. The process gas used in the inductively coupled plasma etching process is a mixture of $CF_4$, $Cl_2$, and $BCl_3$. A ratio of components of the process gas is $CF_4:Cl_2:BCl_3=6:2:1$.

A person having ordinary skill in the art can make proper modifications to the anisotropic etching process and to the process gas selected according to actual needs.

FIG. 5 is schematic diagram showing that an anisotropic etching process is performed to form a LED substrate according to an embodiment of the present invention. The present invention provides a light emitting diode substrate 100, which is an innovative nano-patterned substrate. A pattern of the light emitting diode substrate 100 includes a plurality of convex portions 120 and a plurality of concave portions 110 that are spaced apart from each other. Each concave portion 110 has a depth d2 greater than a distance d4 between two adjacent tops of the convex portions 120, and the depth d2 of each concave portion 110 is deeper than 1 μm. Two adjacent concave portions 110 have an interval d3 ranging from 400 nm to 800 nm.

Figure 1:
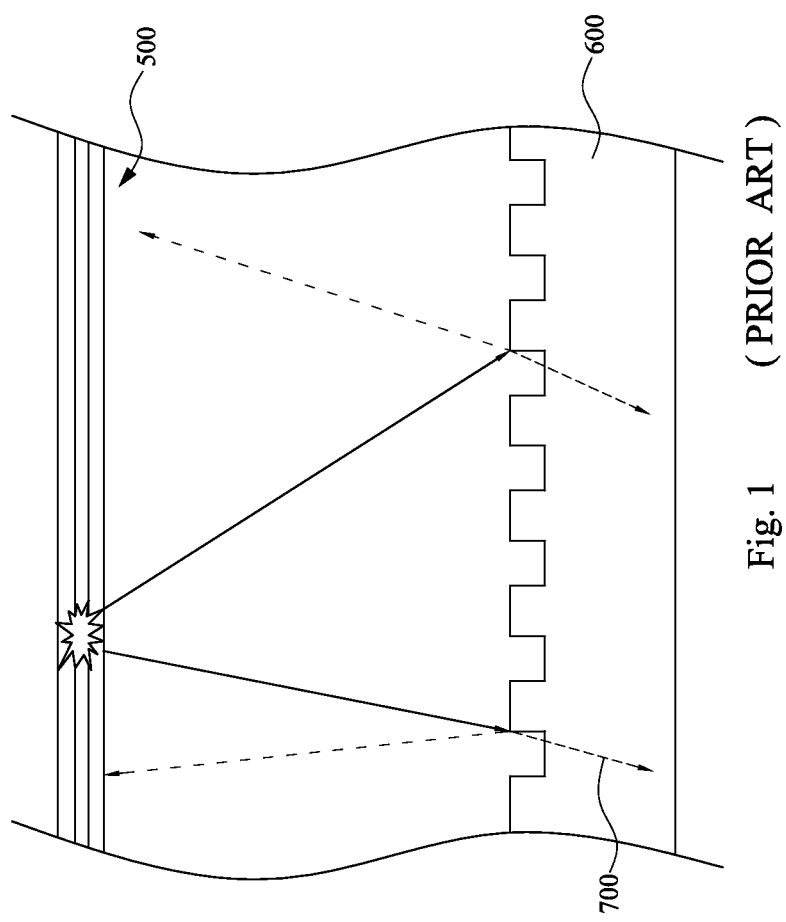
FIG. 1 is a schematic diagram showing a light extraction effect within a conventional LED structure.
Figure 6:
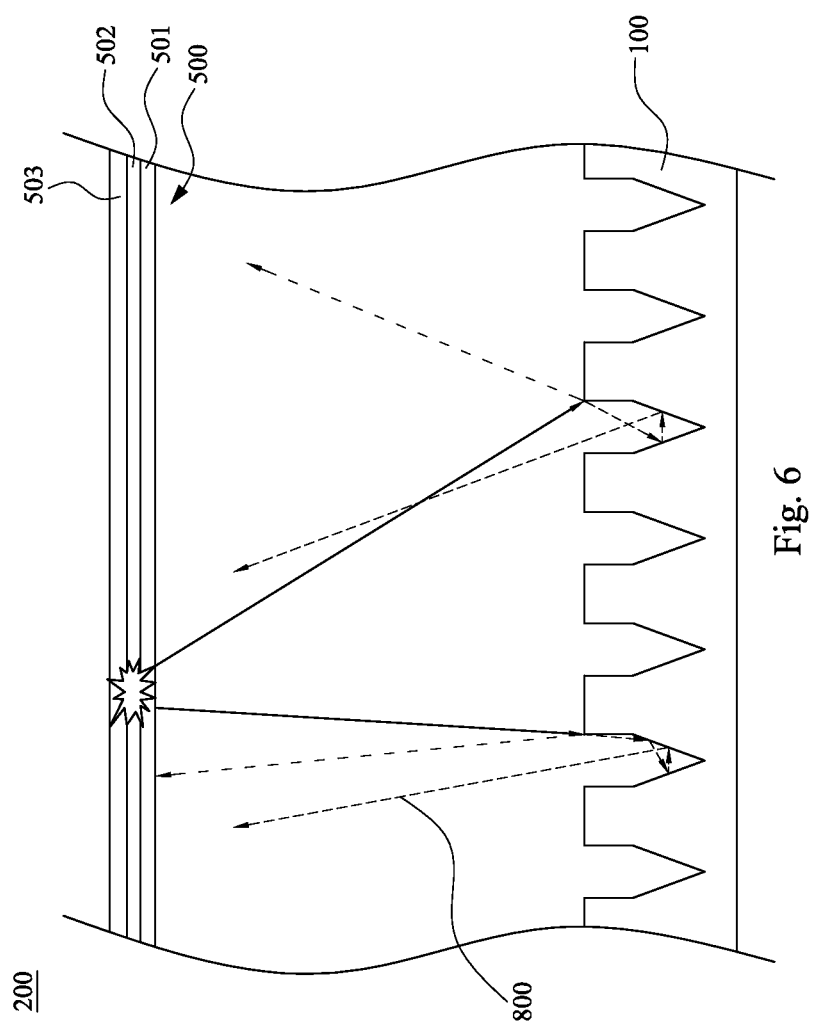
FIG. 6 is schematic diagram showing a light emitting diode structure and its light extraction effect according to an embodiment of the present invention.

FIG. 6 is schematic diagram showing a light emitting diode structure and its light extraction effect according to an embodiment of the present invention. According to an embodiment of the present invention, a light emitting diode structure 200 includes a light emitting multi-layer structure 500 stacked on the light emitting diode substrate 100. The light emitting multi-layer structure 500 includes a P type semiconductor layer 501, an active layer 502, and an N type semiconductor layer 503. When the light emitting diode is used, a power is applied to excite the multiple-layer-emitting structure 500, so that light is generated and radiates out in all directions. The light generated from the light emitting multi-layer structure 500 is emitted to the light emitting diode substrate 100 and then is reflected along a direction 800, such that the light becomes usable. The amount of light generated by the emitting diode structure 200 emitted along the direction 800 is greater than that generated by the conventional substrate 600 (referring to FIG. 1). In brief, the light extraction efficiency of the light emitting diode substrate 100 is greater than that of the conventional substrate 600 (referring to FIG. 1).

The present invention provides a manufacture process of a light emitting diode substrate, which is convenient, fast with high yield, and is effectively applicable to the LED production. The light emitting diode substrate of this invention is deepened in its concave portions. The issue that the concave portions of the conventional light emitting diode substrate cause inefficiency of a light extraction effect is therefore improved. After the light emitting diode structure of this invention is collocated with the light emitting diode substrate of this invention, the ratio of the light transmitted to the substrate to the light absorbed by the substrate is decreased in comparison with a conventional method. In other words, the amount of light reflected to a direction applicable to users is greater than that generated by conventional method. That is to say, the light extraction efficiency is greater than that generated by conventional method.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a light emitting diode (LED) substrate, the method comprising:
   providing a nano-patterned substrate having a plurality of convex portions and a plurality of first concave portions that are spaced apart from each other, wherein each first concave portion has a first depth ($d_1$);
   forming a plurality of protection structures to cover each of the convex portions, and exposing a bottom surface of each of first concave portions, wherein at least one of the protection structures is formed as a part of a sphere or an ellipsoid covering a top surface and a plurality of lateral surfaces of one of the convex portions; and
   performing an anisotropic etching process to etch the bottom surface of each of the first concave portions which is not covered by the protection structure so as to form a plurality of second concave portions having a second depth ($d_2$), wherein $d_2$ is greater than $d_1$, wherein at least one of the second concave portions is formed in a cone shape having a vertex, wherein the protection structures are formed using a maskless pendeo-epitaxy process.

2. The method of claim 1, wherein the nano-patterned substrate is formed by a nanoimprint lithography.

3. The method of claim 1, wherein a top portion of each of the convex portions has a first width ($w_1$), each of the protection structures has a width ($w_2$), and $0 < w_1 < w_2$.

4. The method of claim 3, wherein the protection structures are formed using a metal-organic chemical vapor deposition process.

5. The method of claim 4, wherein the protection structures comprise GaN, InGaN or AlGaN.

6. The method of claim 2, wherein the anisotropic etching process is performed using an inductively coupled plasma etching process.

7. The method of claim 6, wherein process gas used in the inductively coupled plasma etching processing is a mixture of $CF_4$, $Cl_2$, and $BCl_3$.

8. The method of claim 7, wherein a ratio of components of the process gas is $CF_4:Cl_2:BCl_3=6:2:1$.

* * * * *